US008466613B2

(12) United States Patent
Yee

(10) Patent No.: US 8,466,613 B2
(45) Date of Patent: Jun. 18, 2013

(54) ORGANIC LIGHT-EMITTING DISPLAY DEVICE AND METHOD OF MANUFACTURING THE SAME

(75) Inventor: Dong-Su Yee, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 325 days.

(21) Appl. No.: 13/017,149

(22) Filed: Jan. 31, 2011

(65) Prior Publication Data

US 2012/0056530 A1 Mar. 8, 2012

(30) Foreign Application Priority Data

Sep. 2, 2010 (KR) ........................ 10-2010-0086171

(51) Int. Cl.
*H01L 51/52* (2006.01)
*H01L 51/56* (2006.01)
*H05K 5/02* (2006.01)
*H01J 9/40* (2006.01)

(52) U.S. Cl.
USPC ...... 313/504; 313/512; 361/679.21; 361/806; 445/25

(58) Field of Classification Search
USPC .......... 313/504, 512; 349/58–60; 361/679.21, 361/679.26, 679.55, 679.56, 806; 362/632–634; 445/25
See application file for complete search history.

(56) References Cited

U.S. PATENT DOCUMENTS 5,406,399 A * 4/1995 Koike ............................ 349/58
2011/0291553 A1* 12/2011 Moon ........................... 313/504

FOREIGN PATENT DOCUMENTS

| JP | 2002-040445 | 2/2002 |
| KR | 10-2007-0043385 | 4/2007 |
| KR | 10-2008-0001137 | 1/2008 |
| KR | 10-2009-0092240 | 8/2009 |

* cited by examiner

*Primary Examiner* — Nimeshkumar Patel
*Assistant Examiner* — Steven Horikoshi
(74) *Attorney, Agent, or Firm* — Robert E. Bushnell, Esq.

(57) ABSTRACT

In an organic light-emitting display device which is thin and has excellent mechanical strength and a method of manufacturing the organic light-emitting display device, the organic light-emitting display device comprises: a panel including a first substrate and a second substrate coupled to each other by a sealing resin interposed between an internal surface of the first substrate and an internal surface of the second substrate, wherein a first concave portion is formed in an outer surface of the first substrate, and a second concave portion is formed in an outer surface of the second substrate; and a buffer cushion disposed in the first concave portion, wherein the density of an edge portion of the buffer cushion is greater than the density of a center portion of the buffer cushion.

18 Claims, 5 Drawing Sheets

ORGANIC LIGHT-EMITTING DISPLAY DEVICE AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on Sep. 2, 2010 and there duly assigned Serial No. 10-2010-0086171.

BACKGROUND OF THE INVENTION

1. Field of the Invention

The present invention relates to an organic light-emitting display device which is thin, and a method of manufacturing the same.

2. Description of the Related Art

Recently, the organic light-emitting display devices market is growing to include digital cameras, video cameras, personal digital assistants (PDAs), or displays for mobile devices such as mobile phones. Accordingly, organic light-emitting display devices are required to be thin, lightweight, and robust against breakage so as to be easily portable. Although a thin substrate is used to manufacture thin and lightweight organic light-emitting display devices, since a buffer member or a polarization member used in the assembly are included, the organic light-emitting display device cannot be made to have less than a predetermined thickness.

SUMMARY OF THE INVENTION

The present invention provides an organic light-emitting display device which is thin and has excellent mechanical strength, and a method of manufacturing the organic light-emitting display device.

According to an aspect of the present invention, there is provided an organic light-emitting display device comprising: a panel including a first substrate and a second substrate coupled to each other by using a sealing resin interposed between an internal surface of the first substrate and an internal surface of the second substrate, wherein a first concave portion is formed in an outer surface of the first substrate, and a second concave portion is formed in an outer surface of the second substrate; and a buffer cushion disposed in the first concave portion, wherein a density of an edge portion of the buffer cushion is greater than that of a center portion of the buffer cushion.

The organic light-emitting display device may further include a frame including a side wall and a lower plate in which a cavity is formed, and accommodating the panel and the buffer cushion, wherein the buffer cushion is accommodated in the cavity.

The organic light-emitting display device may further include a polarization member disposed in the second concave portion.

The first substrate is divided into a display area and a non-display area, an organic light-emitting device (OLED) is disposed in the display area, the sealing resin is disposed in the non-display area, and the first concave portion is formed in an outer surface of the first substrate corresponding to the display area, and corresponding to a part of the non-display area close to the display area.

The edge portion of the buffer cushion is disposed in a region corresponding to a part of the non-display area close to the display area, and the center portion of the buffer cushion is disposed in a region corresponding to the display area.

The buffer cushion may include urethane-based and acrylic-based materials, and an adhesive material is applied to a surface facing the first concave portion.

The cavity is formed in a region corresponding to the first concave portion.

The organic light-emitting display device may further include an adhesive member disposed between the lower plate and the panel.

The side wall is spaced apart from the panel.

The side wall surrounds side surfaces of the panel.

According to another aspect of the present invention, there is provided a method of manufacturing an organic light-emitting display device, the method comprising: providing a first substrate and a second substrate; manufacturing a panel by coupling the first substrate and the second substrate to each other by using a sealing resin between an internal surface of the first substrate and an internal surface of the second substrate, forming a first concave portion in an outer surface of the first substrate, and forming a second concave portion in an outer surface of the second substrate; disposing a buffer cushion in the first concave portion, wherein a density of an edge portion of the buffer cushion is greater than that of a center portion of the buffer cushion; and accommodating the panel and the buffer cushion in a frame including a side wall and a lower plate in which a cavity is formed, wherein the buffer cushion is accommodated in the cavity.

The manufacturing of the panel may further include disposing a polarization member in the second concave portion.

The method may further include disposing an adhesive member between the lower plate and the panel before accommodating the panel and the buffer cushion in the frame.

The first substrate is divided into a display area and a non-display area, an OLED is disposed in the display area, the sealing resin is disposed in the non-display area, and the first concave portion is formed in an outer surface of the first substrate corresponding to the display area, and corresponding to a part of the non-display area close to the display area.

The edge portion of the buffer cushion is disposed in a region corresponding to a part of the non-display area close to the display area, and the center portion of the buffer cushion is disposed in a region corresponding to the display area.

The buffer cushion may include urethane-based and acrylic-based materials, and an adhesive material is applied to a surface facing the first concave portion.

The side wall is spaced apart from the panel.

The side wall surrounds side surfaces of the panel.

Another aspect, characteristics, and advantages of the present invention will become clearer from the following drawings, claims, and the detailed description of the present invention.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Various changes in form and detail may be made therein, and thus the invention should not be construed as being limited to the embodiments set forth herein. As the inventive concept is not limited to the embodiments described in the present description, it should therefore be understood that the inventive concept does not include every kind of variation example or alternative equivalent included in the spirit and scope of the inventive concept. In the description, detailed descriptions of well-known functions and structures may be omitted so as not to hinder the understanding of the present invention.

In the present description, terms such as "first", "second", etc. are used to describe various elements. However, it is obvious that the elements should not be defined by these terms. The terms are used only for distinguishing one element from another element.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

An exemplary embodiment according to the present invention will now be described in detail with reference to the accompanying drawings.

Figure 1:
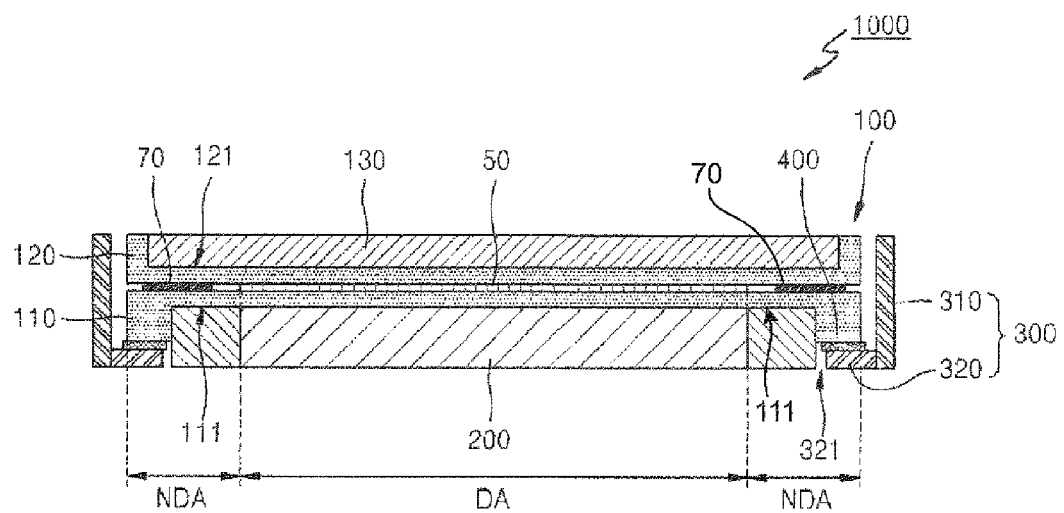
FIG. 1 is a cross-sectional view illustrating an organic light-emitting display device according to an embodiment of the present invention.

FIG. 1 is a cross-sectional view illustrating an organic light-emitting display device according to an embodiment of the present invention.

Referring to FIG. 1, the organic light-emitting display device 1000 includes a panel 100 in which a first substrate 110 and a second substrate 120 are coupled together by using a sealing resin 70, a polarization member 130, a buffer cushion 200, an adhesive member 400, and a frame 300. Although not shown in FIG. 1, the organic light-emitting display device 1000 may further include a printed circuit board (PCB) (not shown) and a flexible circuit board (not shown) for connecting the panel 100 and the PCB.

The panel 100 includes the first substrate 110 and the second substrate 120. The first substrate 110 and the second substrate 120 are coupled together by using the sealing resin 70 interposed between an internal surface of the first substrate 110 and an internal surface of the second substrate 120, and disposed at edges of the first substrate 110. The sealing resin 70 may be a sealant or a frit. The first substrate 110 and the second substrate 120 are coupled by hardening the sealing resin 70 by joule heat, a laser, or ultra violet (UV) light, and thus an organic light-emitting device (OLED) disposed between the first substrate 110 and the second substrate 120 may be sealed.

The first substrate 110 is divided into a display area DA and non-display areas NDA. The display area DA is a region for substantially displaying an image and includes a pixel 50. Electronic devices, such as an OLED and a thin film transistor (TFT), are disposed in the pixel 50. The non-display area NDA is a region not displaying an image and includes the sealing resin 70. The pixel 50 included in the display area DA will be described in detail below with reference to FIG. 2.

According to the current embodiment of the present invention, a first concave portion 111 is formed in an outer surface of the first substrate 110, and a concave portion 121 is formed in an outer surface of the second substrate 120. In this regard, the first concave portion 111 is formed in the outer surfaces of the first substrate 110 corresponding to the display area DA, and corresponding to a part of each of the non-display areas NDA close to the display area DA. The part of each of the non-display areas NDA may be the entire region in which the sealing resin 70 is disposed, or it may be a part of the region in which the sealing resin 70 is disposed. In other words, in the first substrate 110, thicknesses of the display area DA and a part of the non-display area NDA may be less than a thickness of the remaining non-display area NDA. In the first substrate 110, if a thickness of the non-display area NDA in which the first concave portion 111 is not formed is about 0.3t mm (where t is a positive real number), a thickness of the display area DA in which the first concave portion 111 is formed may be about 0.1t mm. In other words, the first concave portion 111 may be formed to a depth which is two-thirds the thickness of the first substrate 110. If the thickness of the first concave portion 111 is greater than 0.2t mm, the first substrate 110 may be broken due to an impact, or if the thickness of the first concave portion 111 is less than 0.2t mm, when the buffer cushion 200 is placed in the first concave portion 111, the thickness of the organic light-emitting display device 1000 may be increased. However, the present invention is not limited thereto, and the first concave portion 111 may be formed only in the outer surface of the first substrate 110 corresponding to the display area DA.

In addition, the second concave portion 121 is formed in outer surfaces of the second substrate 120 corresponding to the display area DA, and corresponding to a part of each of the non-display areas NDA close to the non-display area NDA. In other words, in the second substrate 120, thicknesses of the display area DA and a part of the non-display area NDA may be less than the thickness of the remaining non-display area NDA. In the second substrate 120, if a thickness of the non-display area NDA, in which the second concave portion 121 is not formed, is about 0.3t mm (where t is a positive real number), a thickness of the display area DA in which the second concave portion 121 is formed may be about 0.1t mm. In other words, the second concave portion 121 may be formed to a depth which is two-thirds the thickness of the second substrate 120. If the thickness of the second concave portion 121 is greater than 0.2t mm, the second substrate 120 may be broken due to an impact, or if the thickness of the second concave portion 121 is less than 0.2t mm, when the polarization member 130 is placed in second concave portion 121, the thickness of the organic light-emitting display device 1000 may be increased. However, the present invention is not limited thereto, and the second concave portion 121 may be formed only in the outer surface of the second substrate 120 corresponding to the display area DA.

Cross-sections of the first concave portion 111 and the second concave portion 121 may have a quadrilateral shape, one surface of which is opened, or they may have a shape having a curvature. The shapes of the first concave portion 111 and the second concave portion 121 may vary when necessary.

According to the current embodiment of the present invention, a concave portion is formed in each of the first concave portion 111 and the second concave portion 121 so as to reduce their weights, thereby reducing stress occurring in portions in which the sealing resins 70 are disposed. Accordingly, cracks due to the stress occurring in the portions in which the sealing resins 70 are disposed may be remarkably reduced.

The buffer cushion 200 is disposed in the first concave portion 111. The buffer cushion 200 may include urethane-based and acrylic-based materials, and protects the panel 100 from an external impact. For example, the buffer cushion 200 may be formed of a sponge, which is made of urethane-based and acrylic-based materials, by foam-molding. In addition, the density of the buffer cushion 200 may be differently controlled according to a foam-molding condition and a ratio of a material to urethane-based material or acrylic-based material. In this regard, as the density of the buffer cushion 200 is increased, the buffer cushion 200 may rapidly absorb impact. On the other hand, as the density of the buffer cushion 200 is decreased, the buffer cushion 200 has a high impact absorption ability with respect to large impacts. Accordingly, the buffer cushion 200 having a low density is better for absorbing large impacts.

Meanwhile, an adhesive material may be applied to a surface of the buffer cushion 200 opposite to the first concave portion 111 so as to be adhered to the panel 100. The buffer cushion 200 may have a uniform thickness, and the thickness may be on average in the range of about 0.23t to about 0.33t mm (where t denotes a positive real number).

In the buffer cushion 200 according to the current embodiment of the present invention, the density of an edge portion is greater than that of a center portion. In this regard, the edge portion of the buffer cushion 200 may be disposed so as to correspond to a part of the non-display area NDA close to the display area DA, and the center portion may be disposed so as to correspond to the display area DA. A density of the buffer cushion 200 may vary with a concentration gradient, or it may vary with a boundary at which the density of the buffer cushion 200 is clearly distinguished. The point is that the buffer cushion 200 having a higher density is disposed at a region in which the sealing resin 70 is formed. Thus, since the buffer cushion 200 having a higher density may effectively and rapidly absorb an impact occurring in the region in which the sealing resin 70 is formed, mechanical strength of the organic light-emitting display device 1000 may be improved. Meanwhile, the buffer cushion 200 having a low density is disposed at the region corresponding to the display area DA, and thus impact absorption ability with respect to the display area DA may be increased.

The polarization member 130 may be disposed in the second concave portion 121 so as to suppress external light reflection of the panel 100. The polarization member 130 is disposed so as to improve an optical characteristic of the panel 100, but may be omitted when necessary. The polarization member 130 has a uniform thickness, and the thickness may be on average in the range of about 0.15t to about 0.2t mm (where t denotes a positive real number).

Hereinafter, the thickness of the panel 100 including the buffer cushion 200 and the polarization member 130 will be described. For example, when t is 1, the thickness of the buffer cushion 200 may be about 0.33 mm, the thickness of the polarization member 130 may be about 0.2 mm, and the thicknesses of the first substrate 110 and the second substrate 120 may be about 0.3 mm. However, the first concave portion 111 and the second concave portion 121 having a depth of about 0.2 mm are formed in the first substrate 110 and the second substrate 120, respectively, and the buffer cushion 200 and the polarization member 130 are disposed in the first concave portion 111 and the second concave portion 121, respectively. Thus, a thin panel assembly may be manufactured.

The frame 300 accommodates the panel 100 and the buffer cushion 200. The frame 300 includes a side wall 310 and a lower plate 320. A large cavity 321 is formed in the lower plate 320. The cavity 321 is formed so as to correspond to the first concave portion 111 and accommodates the buffer cushion 200. In other words, the buffer cushion 200 is exposed to the outside through the cavity 321. The side wall 310 and the lower plate 320 may have a thickness of about 0.1t mm (where t denotes a positive real number). The side wall 310 and the lower plate 320 may be formed as one body, and may be adhered to each other when necessary.

Thus, the buffer cushion 200, which is thicker than the first concave portion 111, may be accommodated in the cavity 321 of the frame 300 so that the thickness of the organic light-emitting display device 1000 may be prevented from being increased, and thus the slim organic light-emitting display device 1000 may be manufactured.

When the frame 300 accommodates the panel 100, the frame 300 may further include an adhesive member 400 included between the lower plate 320 and the panel 100 in order to fix the panel 100. The adhesive member 400 may be an adhesive tape or any of various adhesives. The side wall 310 is spaced apart from the panel 100, and is formed so as to surround side surfaces of the panel 100.

Figure 2:
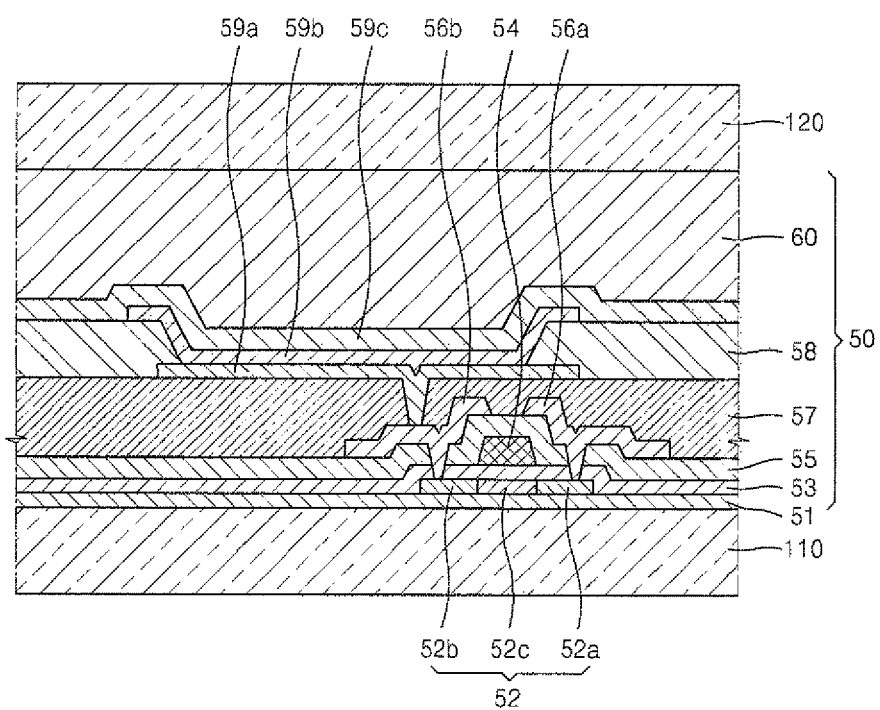
FIG. 2 is a cross-sectional view illustrating a pixel included in a display area of FIG. 1.

FIG. 2 is a cross-sectional view illustrating the pixel included in the display area of FIG. 1.

Referring to FIG. 2, an insulating layer 51 (for example, a barrier layer and/or a buffer layer) may be formed on the first substrate 110 so as to prevent impurity ions from spreading, and so as to prevent water or external air from entering, as well as to planarize a surface of the first substrate 110.

An active layer 52, which is a TFT formed of a semiconductor material, may be formed on the insulating layer 51, and a gate insulating layer 53 is formed so as to cover the active layer 52. The active layer 52 may be formed of an inorganic semiconductor, such as amorphous silicon or poly silicon, or an organic semiconductor. The active layer 52 may includes a source region 52a, a drain region 52b, and a channel region 52c disposed between the source region 52a and the drain region 52b.

A gate electrode 54 is formed on the gate insulating layer 53, and an insulating interlayer 55 is formed so as to cover the gate electrode 54. A source electrode 56a and a drain electrode 56b are formed on the insulating interlayer 55, and a planarization layer 57 and a pixel-defining layer 58 are sequentially formed so as to cover the source electrode 56a and the drain electrode 56b.

The gate insulating layer 53, the insulating interlayer 55, the planarization layer 57, and the pixel-defining layer 58 may be formed of an insulating material so as to have a single layer structure or a multi-layered structure, and may be formed of an organic material, an inorganic material, or an organic/inorganic composite material. However, the stacked structure of the TFT is not limited thereto, and may have any of various structures.

Meanwhile, a pixel electrode 59a, which is an electrode of an OLED, may be formed on the planarization layer 57, and a pixel-defining layer 58 may be formed on the pixel electrode 59a. A predetermined opening is formed in the pixel-defining layer 58 so as to expose the pixel electrode 59a, and an organic light-emitting layer 59b of the OLED is then formed on the pixel electrode 59a.

The OLED emits red, green and blue light according to the flow of current. The OLED includes the pixel electrode 59a contacting the drain electrode 56b of the TFT through a contact hole, a counter electrode 59c covering the entire pixel, and the organic light-emitting layer 59b which is disposed between the pixel electrode 59a and the counter electrode 59c, and which emits light.

The pixel electrode 59a and the counter electrode 59c are insulated from each other by the organic light-emitting layer 59b. Voltages having different polarities are applied to the organic light-emitting layer 59b so that the organic light-emitting layer 59b emits light.

The organic light-emitting layer 59b may be a low-molecular weight organic layer or a polymer organic layer. The organic light-emitting layer 59b may include a hole injection layer (HIL), a hole transport layer (HTL), an emission layer (EML), an electron transport layer (ETL), and an electron injection layer (EIL) which are stacked in a single layer structure or a multi-layered structure. An organic material used to form the organic light-emitting layer 59b may be copper phthalocyanine (CuPc), N,N'-Di(naphthalene-1-yl)-N,N'-diphenyl-benzidine (NPB), tris-8-hydroxyquinoline aluminum (Alq3), or the like. The organic layer may be formed by using a vacuum evaporation method. The HIL, the HTL, the ETL and the EIL, which are common layers, may be commonly used in red, green and blue pixels. Accordingly, unlike FIG. 2, the common layers may be formed so as to cover the entire pixel similar to the counter electrode 59c.

The pixel electrode 59a may function as an anode, and the counter electrode 59c may function as a cathode. Alternatively, the polarities of the pixel electrode 59a and the counter electrode 59c may be reversed.

In a bottom emission type display, in which an image is displayed toward the first substrate 110, the pixel electrode 59a may be a transparent electrode, and the counter electrode 59c may be a reflection electrode. At this point, the pixel electrode 59a may be formed of a high-work function material, for example, ITO, IZO, ZnO, In2O3, etc., and the counter electrode 59c may be formed of a low-work function metal, for example, Ag, Mg, Al, Pt, Pd, Au, Ni, Nd, Ir, Cr, Li, Ca, etc.

In a top emission type display, in which an image is displayed toward the counter electrode 59c, the pixel electrode 59a may be a reflection electrode, and the pixel electrode 59a may be a transparent electrode. The reflection electrode, which is the pixel electrode 59a, may include a reflection layer which is formed of any one selected from the group consisting of Ag, Mg, Al, Pt, Pd, Au, Ni, Nd, Ir, Cr, Li, and Ca, or a combination thereof, and a high-work function material, for example, ITO, IZO, ZnO, $In_2O_3$, etc. The transparent electrode, which is the counter electrode 59c, may be formed by depositing a low-work function metal which is any one selected from the group consisting of Ag, Mg, Al, Pt, Pd, Au, Ni, Nd, Ir, Cr, Li, and Ca, or a combination thereof, and then forming an auxiliary electrode layer or a bus electrode line formed of a transparent conductive material, for example, ITO, IZO, ZnO, or $In_2O_3$, thereon.

In a both-sides emission type display, both the pixel electrode 59a and the counter electrode 59c may be a transparent electrode. However, as illustrated in FIG. 1, when the first substrate 110 is seated in the frame 300, the organic light-emitting display device 1000 may be a top emission type display in which an image is displayed toward the second substrate 120.

The pixel electrode 59a and the counter electrode 59c may not be formed of the above-described materials, and may be formed of a conductive organic material or a conductive paste including conductive particles, such as Ag, Mg, Cu, or the like. When the conductive paste is used to form the pixel electrode 59a and the counter electrode 59c, the pixel electrode 59a and the counter electrode 59c may be printed by using an inkjet printing method, and then may be calcined.

A passivation layer 60, which is formed of an organic material, an inorganic material, or an organic/inorganic composite material, may further be formed on the counter electrode 59c so as to cover the OLED. The second substrate 12 may be formed on the passivation layer 60.

FIGS. 3 thru 9 are cross-sectional views for explaining a method of manufacturing the organic light-emitting display device of FIG. 1.

Figure 3:
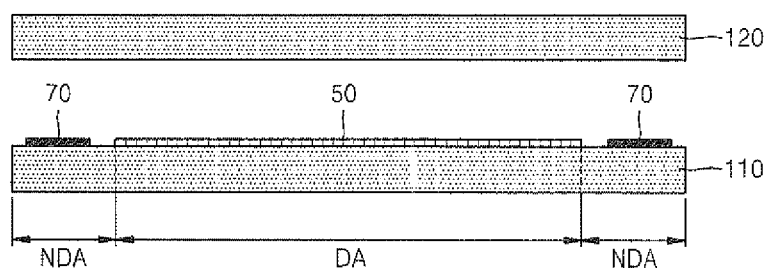
FIGS. 3 thru 9 are cross-sectional views for explaining a method of manufacturing the organic light-emitting display device of FIG. 1.

Referring to FIG. 3, the first substrate 110 and the second substrate 120 are provided. The first substrate 110 and the second substrate 120 may be a transparent glass or a plastic substrate formed of polyimide (PI). The pixel 50, including an electronic device such as an OLED or a TFT, may be disposed in the display area DA of the first substrate 110. The sealing resin 70, such as a sealant or a frit, may be disposed in the non-display area NDA of the first substrate 110.

Figure 4:
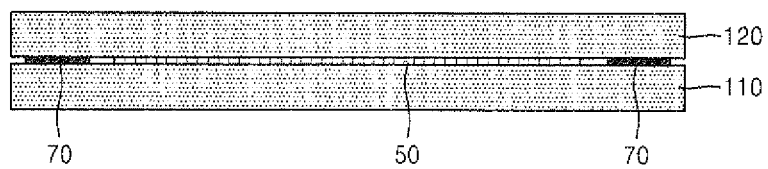

Referring to FIG. 4, the first substrate 110 and the second substrate 120 may be coupled by using the sealing resin 70. In detail, an internal surface of the first substrate 110 and an internal surface of the second substrate 120 are coupled so as to face each other, and the sealing resin 70 is hardened by applying light or heat in a region at which the sealing resin 70 is disposed, thereby sealing the first substrate 110 and the second substrate 120.

Figure 5:
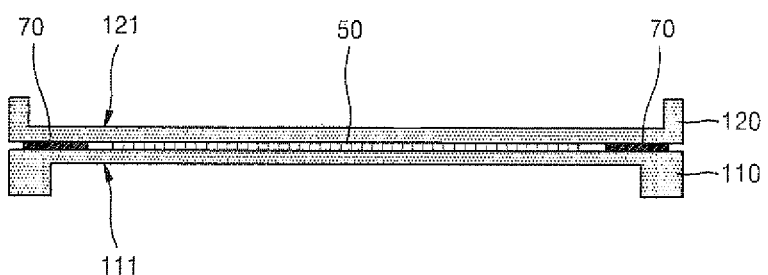

Referring to FIG. 5, the first concave portion 111 is formed in an outer surface of the first substrate 110, and the second concave portion 121 is formed in an outer surface of the second substrate 120. The first concave portion 111 and the second concave portion 121 may be formed by wet etching or dry etching. In this regard, the outer surface is a surface opposite to an internal surface of a substrate to which the electronic device is adhered. The first concave portion 111 may be formed in the display area DA and in a part of each of the non-display areas NDA. In detail, the first concave portion 111 is formed in the display area DA and even in the non-display area NDA close to the display area DA. The second concave portion 121 may also be formed in the display area DA and in a part of each of the non-display areas NDA. The second concave portion 121 may be formed so as to have a size corresponding to that of the first concave portion 111. However, the present invention is not limited thereto, and thus the second concave portion 121 may be formed over a wider region. The shapes, depths, and arrangements of the first concave portion 111 and the second concave portion 121 have been described above in detail with reference to FIG. 1, and thus a repeated description thereof will be omitted.

Figure 6:
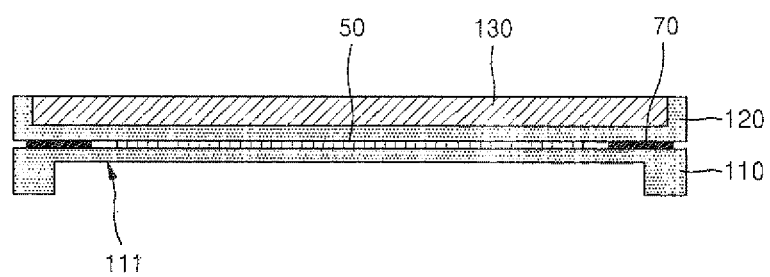

Referring to FIG. 6, the polarization member 130 is disposed in the second concave portion 121. The polarization member 130 is disposed so as to improve an optical characteristic of the organic light-emitting display device 1000. An adhesive material is applied to a surface of the polarization member 130 facing the second concave portion 121, and thus the polarization member 130 and the second substrate 120 may be coupled to each other by the adhesive material.

Figure 7:
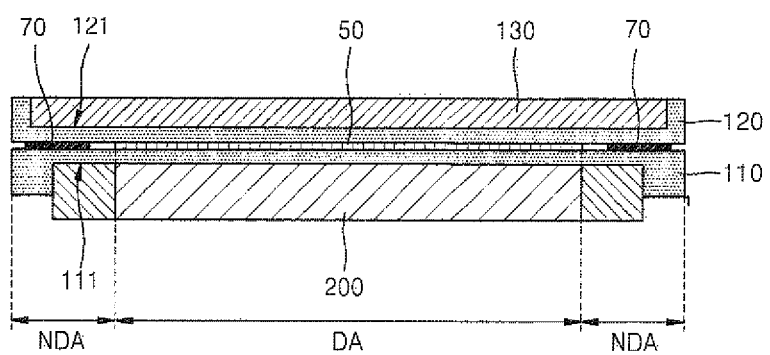

Referring to FIG. 7, the buffer cushion 200 is disposed in the first concave portion 111. In the buffer cushion 200, the density of an edge portion is greater than that of a center portion. In this regard, the edge portion of the buffer cushion 200 may be disposed so as to the non-display area NDA, and correspond to the center portion may be disposed so as to correspond to the display area DA. In detail, referring to FIG. 7, the buffer cushion 200 may be disposed so as to correspond to a part of the non-display area NDA which is close to the display area DA. In this regard, the non-display area NDA is a region in which the sealing resin 70 is disposed. Thus, since the buffer cushion 200 having a higher density may effectively and rapidly absorb an impact occurring in the region in which the sealing resin 70 is formed, the mechanical strength of the organic light-emitting display device 1000 may be improved. Meanwhile, the buffer cushion 200 having a low density is disposed at the region corresponding to the display area DA, and thus the impact absorption ability with respect to the display area DA may be increased.

In addition, since the adhesive material is applied to a surface of the buffer cushion 200 facing the first concave portion 111 of the first substrate 110, the buffer cushion 200 and the panel 100 may be firmly adhered to each other. The material, thickness, and various modified examples of the buffer cushion 200 have been described above in detail with reference to FIG. 1, and thus a repeated description thereof will be omitted.

The processes of FIGS. 6 and 7 may be simultaneously performed regardless of the order. The process of FIG. 7 may be performed before the process of FIG. 6. Alternatively, when the polarization member 130 is omitted, the process of FIG. 6 may be omitted when necessary.

Figure 8:
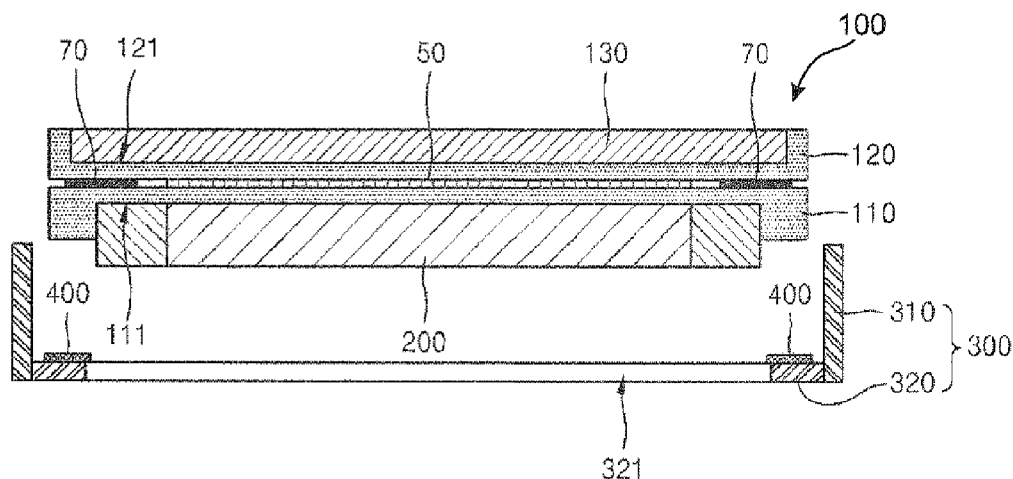

Referring to FIG. 8, the adhesive member 400 is disposed between the lower plate 320 of the frame 300 and the panel 100, and the frame 300 accommodates the panel 100 and the buffer cushion 200. In particular, the frame 300 according to the current embodiment of the present invention includes the side wall 310 and the lower plate 320, and the cavity 321 is formed in the lower plate 320. The buffer cushion 200 is accommodated in the cavity 321 of the lower plate 320 so that the entire thickness of the organic light-emitting display device 1000 may be prevented from being decreased due to the thickness of the buffer cushion 200. In this regard, the side wall 310 of the frame 300 is spaced apart from the panel 100, and the side wall 310 surrounds the side walls of the frame 300 so as to protect the panel 100 against impacts and vibrations, thereby maintaining the uniform shape of the organic light-emitting display device 1000.

Figure 9:
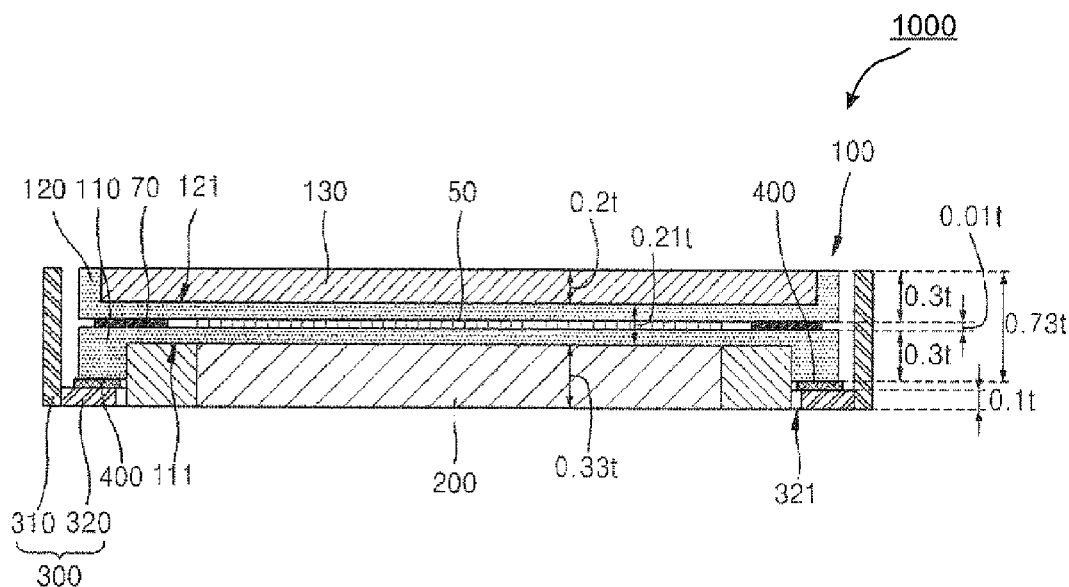

FIG. 9 illustrates the organic light-emitting display device 1000 including the buffer cushion 200, the polarization member 130, the panel 100 and the frame 300, which are coupled to one another. For example, if t is 1, the polarization member 130 may have a thickness of about 0.2 mm, the first substrate 110 and the second substrate 120 may have a thickness of 0.3 mm, and the lower plate 320 may have a thickness of about 0.1 mm. According to the current embodiment of the present invention, the first concave portion 111 and the second concave portion 121 have a depth of about 0.2 mm so as to offset the heights of the polarization member 130 and the buffer cushion 200. In addition, the cavity 321 is formed in the lower plate 320 of the frame 300 so as to further offset the height of the buffer cushion 200. Consequently, the entire thickness of the organic light-emitting display device 1000 is about 0.73 mm, and thus the slim organic light-emitting display device 1000 having a thickness of about 1 mm may be manufactured. However, the present invention is not limited thereto, and since t may be a positive real number, the thickness of each element is not limited to the case wherein t is 1. That is, if t is 0.7 or 0.5, the thickness of the organic light-emitting display device 1000 according to the current embodiment of the present invention may be further decreased.

In the present invention, the organic light-emitting display device 1000 is described as an example. However, the present invention is not limited thereto, and thus the present invention may be applied to various flat panel display devices, for example, a liquid crystal display (LCD), a plasma display panel (PDP), etc.

According to an organic light-emitting display device and a method of manufacturing the same of the present invention, concave portions are formed in an upper external surface and a lower external surface of a panel, and a polarization member and a buffer cushion are disposed in the concave portions, and thus the slim organic light-emitting display device may be manufactured. In addition, a cavity is formed in a frame accommodating the panel, and a part of the panel is accommodated in the cavity, and thus the thickness of the organic light-emitting display device may be further decreased.

In addition, in the buffer cushion accommodated in the concave portion, the density of a portion corresponding to a non-display area of the panel is lower than that of a portion corresponding to the non-display area of the panel, and thus the mechanical strength of the non-display area may be improved.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. An organic light-emitting display device, comprising:
   a panel including a first substrate and a second substrate coupled to each other by a sealing resin interposed between an internal surface of the first substrate and an internal surface of the second substrate, wherein a first concave portion is formed in an outer surface of the first substrate, and a second concave portion is formed in an outer surface of the second substrate; and
   a buffer cushion disposed in the first concave portion, wherein a density of an edge portion of the buffer cushion is greater than a density of a center portion of the buffer cushion.

2. The organic light-emitting display device of claim 1, further comprising a frame including a side wall and a lower plate in which a cavity is formed and accommodating the panel and the buffer cushion, wherein the buffer cushion is accommodated in the cavity.

3. The organic light-emitting display device of claim 2, wherein the cavity is formed in a region corresponding to the first concave portion.

4. The organic light-emitting display device of claim 2, further comprising an adhesive member disposed between the lower plate and the panel.

5. The organic light-emitting display device of claim 2, wherein the side wall is spaced apart from the panel.

6. The organic light-emitting display device of claim 2, wherein the side wall surrounds side surfaces of the panel.

7. The organic light-emitting display device of claim 1, further comprising a polarization member disposed in the second concave portion.

8. The organic light-emitting display device of claim 1, wherein the first substrate is divided into a display area and a non-display area, an organic light-emitting device (OLED) is disposed in the display area, the sealing resin is disposed in the non-display area, and the first concave portion is formed in an outer surface of the first substrate corresponding to the display area and corresponding to a part of the non-display area close to the display area.

9. The organic light-emitting display device of claim 8, wherein the edge portion of the buffer cushion is disposed in a region corresponding to a part of the non-display area close to the display area, and the center portion of the buffer cushion is disposed in a region corresponding to the display area.

10. The organic light-emitting display device of claim 1, wherein the buffer cushion comprises urethane-based and acrylic-based materials, and an adhesive material is applied to a surface facing the first concave portion.

11. A method of manufacturing an organic light-emitting display device, the method comprising the steps of:
  providing a first substrate and a second substrate;
  manufacturing a panel by coupling the first substrate and the second substrate to each other by using a sealing resin between an internal surface of the first substrate and an internal surface of the second substrate, forming a first concave portion in an outer surface of the first substrate, and forming a second concave portion in an outer surface of the second substrate;
  disposing a buffer cushion in the first concave portion, wherein a density of an edge portion of the buffer cushion is greater than a density of a center portion of the buffer cushion; and
  accommodating the panel and the buffer cushion in a frame including a side wall and a lower plate in which a cavity is formed, wherein the buffer cushion is accommodated in the cavity.

12. The method of claim 11, wherein the step of manufacturing the panel further comprises disposing a polarization member in the second concave portion.

13. The method of claim 11, further comprising disposing an adhesive member between the lower plate and the panel before accommodating the panel and the buffer cushion in the frame.

14. The method of claim 11, wherein the first substrate is divided into a display area and a non-display area, an OLED is disposed in the display area, the sealing resin is disposed in the non-display area, and the first concave portion is formed in an outer surface of the first substrate corresponding to the display area and corresponding to a part of the non-display area close to the display area.

15. The method of claim 14, wherein the edge portion of the buffer cushion is disposed in a region corresponding to a part of the non-display area close to the display area, and the center portion of the buffer cushion is disposed in a region corresponding to the display area.

16. The method of claim 11, wherein the buffer cushion comprises urethane-based and acrylic-based materials, and an adhesive material is applied to a surface facing the first concave portion.

17. The method of claim 11, wherein the side wall is spaced apart from the panel.

18. The method of claim 11, wherein the side wall surrounds side surfaces of the panel.

* * * * *